United States Patent
Loubet et al.

(10) Patent No.: US 7,776,745 B2
(45) Date of Patent: Aug. 17, 2010

(54) METHOD FOR ETCHING SILICON-GERMANIUM IN THE PRESENCE OF SILICON

(75) Inventors: Nicolas Loubet, Grenoble (FR); Didier Dutartre, Meylan (FR); Alexandre Talbot, Grenoble (FR); Laurent Rubaldo, Fontaine (FR)

(73) Assignee: STMicroelectronics S.A., Montrouge (FR)

( * ) Notice: Subject to any disclaimer, the term of this patent is extended or adjusted under 35 U.S.C. 154(b) by 237 days.

(21) Appl. No.: 11/704,799

(22) Filed: Feb. 9, 2007

(65) Prior Publication Data
US 2007/0190787 A1    Aug. 16, 2007

(30) Foreign Application Priority Data
Feb. 10, 2006   (FR) .................................. 06 50484

(51) Int. Cl.
*H01L 21/302* (2006.01)
(52) U.S. Cl. .............................. 438/689; 257/E21.215; 257/E21.218
(58) Field of Classification Search ........................ None
See application file for complete search history.

(56) References Cited

U.S. PATENT DOCUMENTS

| 6,713,356 | B1 | 3/2004 | Skotnicki et al. |
| 6,858,503 | B1 * | 2/2005 | Ngo et al. .................... 438/285 |
| 7,147,709 | B1 * | 12/2006 | Ong et al. ....................... 117/3 |
| 2008/0207004 | A1 * | 8/2008 | Sparks ........................ 438/739 |

FOREIGN PATENT DOCUMENTS

WO    2007/003220    *    1/2007

OTHER PUBLICATIONS

French Search Report from corresponding French Application No. 06/50484 filed Feb. 10, 2006.
Bogumilowicz Y et al: "*Chemical vapour etching of Si, SiGe and Ge with HCl; applications to the formation of thin relaxed SiGe buffers and to the relevant of threading dislocations; Chemical vapour etching of Si, SiGe and Ge with HCl*" Semiconductor Science and Technology, IOP, Bristol, GB, vol. 20, No. 2, Feb. 1, 2005, pp. 127-134, XP020086419 ISSN: 0268-1242.

* cited by examiner

*Primary Examiner*—Allan Olsen
(74) *Attorney, Agent, or Firm*—Lisa K. Jorgenson; James H. Morris; Wolf, Greenfield & Sacks, P.C.

(57) ABSTRACT

A method for selectively etching single-crystal silicon-germanium in the presence of single-crystal silicon, including a chemical etch based on hydrochloric acid in gaseous phase at a temperature lower than approximately 700° C.

3 Claims, 1 Drawing Sheet

METHOD FOR ETCHING SILICON-GERMANIUM IN THE PRESENCE OF SILICON

BACKGROUND OF THE INVENTION

1. Field of the Invention

The present invention relates to the manufacturing of semiconductor circuits. More specifically, the present invention relates to the selective etching of single-crystal silicon-germanium (SiGe) in the presence of single-crystal silicon.

2. Discussion of the Related Art

One often has to etch a single-crystal silicon-germanium layer in the presence of single-crystal silicon.

For example, it has been provided to use silicon-germanium as a sacrificial layer interposed between a single-crystal semiconductor substrate and a single-crystal silicon layer to obtain a floating single-crystal silicon layer of very low thickness, for example, lower than 20 nm. This floating silicon layer is currently designated as an SON layer (for Silicon On Nothing).

Such an SON substrate can be used on forming of various components such as, for example, MOS transistors and microresonators.

For a better understanding of a problem that the present invention aims at solving, FIGS. 1A to 1C illustrate, in cross-section view, different steps of the forming of a MOS transistor on an SON substrate according to a known method.

As illustrated in FIG. 1A, a sacrificial silicon-germanium layer 5 is formed on an active region 1 of a single-crystal silicon substrate delimited by insulation areas 3. The silicon-germanium layer usually comprises from 20 to 40% of germanium. A single-crystal silicon layer 7 is then formed on sacrificial layer 5. An insulated gate 9 of a MOS transistor is formed on layer 7. A drain/source implantation, possibly preceded by a silicon expitaxy, is then performed on layer 7 on either side of gate 9.

Silicon-germanium layer 5 is then selectively removed to form an empty interval 11 between silicon region 1 and silicon layer 7. With current methods, this requires use of a protection mask 13 shown in FIG. 1B, as will be explained hereafter.

After removal of mask 13, the method carries on as illustrated in FIG. 1C by filling interval 11, for example, with an insulator 15 (but also possibly with an insulated conductive layer if a dual-gate transistor or a gate all-around transistor are desired to be formed).

A disadvantage of such a method especially lies in known methods for selectively etching sacrificial layer 5.

It has been provided to remove the silicon-germanium by means of a liquid etch with a liquid containing potassium or sodium. Such a method is very selective. However, potassium and sodium are light elements, very contaminating, which pass into the silicon of layer 7 and of region 1 as well as into insulation regions 3 and modify their conductivities. Further, the use of liquid solutions, even in the presence of surfactants, is not desirable to etch structures of very small dimensions, that is, on the order of a few nanometers.

It should be noted that the selectivity of etching of a first material in the presence of a different material can not be deduced directly from a separate study of the kinetics of the etching of each of these materials considered alone.

As an example of this fact, it has also been provided to remove the silicon-germanium by means of a dry etch using a carbon tetrafluoride plasma ($CF_4$) in the presence of argon. Such an etching, which is not contaminating, is generally considered as strongly selective with respect to silicon, and so it is for the etching of a silicon-germanium surface close to a silicon surface. However, it can be observed that the etch selectivity becomes very insufficient in the case considered herein where a silicon-germanium layer is desired to be removed under a silicon layer.

Such a non-selectivity in a tetrafluoride plasma in the presence of argon is mainly attributed to the following reasons. First, the kinetics are astonishly modified when two materials are both present with respect to the case they are alone. Second, higher the density of the circuits processed, more important such a modification. Third, usually the kinetics of an etching is studied along a given crystalline direction and more generally along the horizontal direction, that is the [001] crystalline direction. It has been evidenced that the kinetics of a single given material along different directions are different. Additionally, the difference of selectivity between two materials varies from a direction to one another. In the present case, the selectivity is highly unpredictable as one seeks to etch away not only a first material (silicon-germanium) in the presence of a second one (silicon) but seeks additionally to etch away this first material laterally along the [110] direction while the second material is mainly exposed to the etchant horizontally along the [001] direction. These difficulties are increased when the first material lies under the second.

This is why a mask 13 for protecting the upper surface of silicon layer 7 needs to be provided during the etching of the sacrificial silicon-germanium layer. To arrange mask 13, a sequence of photolithography steps needs to be carried out. This sequence uses a mask which is not self-aligned with respect to gate 9, with the well-known disadvantages of the insertion of a non-self-aligned masking step.

However, even using the mask 13, one observes a lower selectivity than the expected one, due to the unpredictable effects of the combined presence of silicon and silicon-germanium with a high density and of the exposition of the silicon layer to the etchant laterally, along direction [110].

As an another example of the above facts, the article "Chemical vapor etching of Si, SiGe and Ge with HCl; application to the formation of thin relaxation of threading dislocations" by Y. Bogumilowicz and al. published in Semiconductor Science and Technology 20(2005)127-134 studies the etching kinetics of silicon and of silicon-germanium. The kinetics are studied separately for each material. They are studied only along the single [001] direction. According to the numerous above-exposed well-known phenomenon appearing when a first given material has to be etched away in the presence of and under a second and different material and to be etched away along the unusual lateral direction while the second material is exposed horizontally and laterally to the etchant, this article gives no teachings about the kinetics when both silicon and silicon-germanium are present. In addition, the way in which the kinetics would vary while the density of the elements exposed to the etchant is high is unknown.

SUMMARY OF THE INVENTION

The present invention aims at providing a method for etching silicon-germanium in the presence of silicon which overcomes all or part of the disadvantages of known methods.

The present invention aims at providing such a method which does not result in a contamination of the formed semiconductor component.

The present invention also aims at providing such a method which is simple to implement and self-aligned.

To achieve these and other objects, the present invention provides, in a method of chemical vapor etching type (CVE), using as an etchant hydrochloric acid at a temperature lower than approximately 700° C.

According to an embodiment of the present invention, the etching is performed in the presence of a carrier gas selected from the group comprising hydrogen, helium, nitrogen, and argon.

According to an embodiment of the present invention, the etching temperature ranges between 450 and 700° C. for silicon-germanium comprising from 10 to 50% of germanium.

According to an embodiment of the present invention, the partial pressure of the hydrochloric acid in hydrogen ranges between approximately 20 and approximately 10,000 Pa for silicon-germanium comprising from 10 to 50% of germanium.

According to an embodiment of the present invention, the silicon-germanium comprises approximately 30% of germanium, the hydrochloric acid pressure being on the order of 30,000 Pa, the temperature being approximately 650° C.

According to an embodiment of the present invention, the silicon-germanium comprises approximately 30% of germanium, the hydrochloric acid being mixed with hydrogen, the partial hydrochloric acid pressure being on the order of 20 Pa, the partial hydrogen pressure being on the order of 2,000 Pa, the temperature being approximately 700° C.

The present invention applies to the forming of a single-crystal silicon layer locally isolated from an underlying single-crystal silicon substrate by a vacuum, comprising the steps of forming a single-crystal silicon-germanium layer on the substrate; forming the silicon layer on the single-crystal silicon-germanium layer; and removing the silicon-germanium layer by the above method.

According to an embodiment of the present invention, the silicon layer has a thickness from approximately 5 nm to 20 nm.

According to an embodiment of the present invention, the silicon-germanium layer has a thickness from approximately 10 nm to 30 nm.

According to an embodiment of the present invention, the silicon-germanium layer comprises from approximately 20% to 40% of germanium.

The foregoing and other objects, features, and advantages of the present invention will be discussed in detail in the following non-limiting description of specific embodiments in connection with the accompanying drawings.

DETAILED DESCRIPTION

Figure 1A:
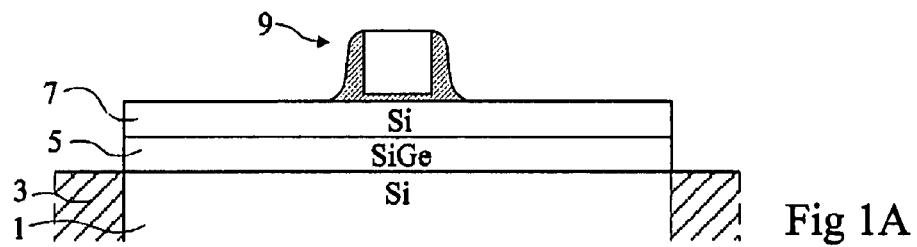
FIGS. 1A to 1C, previously described, are cross-section views illustrating different steps of the forming of a MOS transistor according to a known method.
Figure 1B:
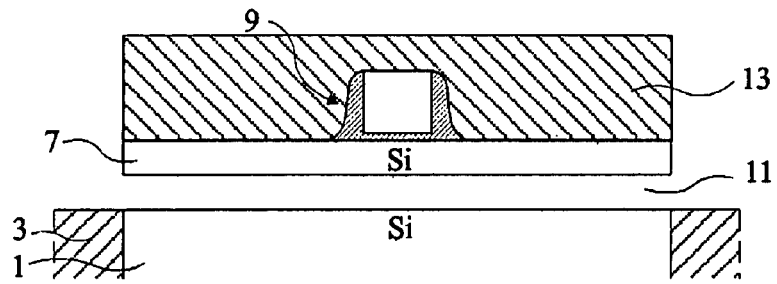

As usual in the representation of semiconductor components, the various cross-section views are not to scale.

The present invention provides a method that is very selective for etching silicon-germanium with respect to silicon.

The present invention provides, in a method of chemical vapor etch type (CVE) using hydrochloric acid as an etchant.

This type of method is typically used to etch silicon and it was thus not envisaged to use it to etch a material (silicon-germanium) selectively with respect to silicon. However, against this prejudice, the applicant has performed comparative tests of silicon and silicon-germanium CVE etching with hydrochloric acid.

The applicant has noted that, in very wide usual pressure ranges, the etch speed of silicon drops below 0.10 nm/minute when the processing temperature falls below 700° C. This speed increases exponentially when the temperature increases above 700° C. Still in a wide pressure range, the etch speed of silicon-germanium is, generally, greater by at least one decade than that of silicon and remains so when the temperature falls below 700° C. while, as indicated hereabove, the etch speed of silicon becomes negligible.

Thus, the applicant provides using a CVE in the presence of hydrochloric acid at a temperature lower than 700° C. to selectively etch the silicon-germanium with respect to silicon. Those skilled in the art will know how to adapt the conditions (pressure and temperature), especially according to the silicon-germanium composition, the etch speed difference increasing, all other things being equal, along with the increase in the germanium rate in the silicon-germanium.

The etching may be performed in the presence of a carrier gas selected from the group comprising hydrogen, helium, nitrogen, and argon.

The etch temperature ranges between approximately 450° C. and approximately 700° C. for silicon-germanium comprising from approximately 10% to 50% of germanium. It should be understood that the higher the germanium proportion in the silicon-germanium, the lower the temperature can be.

The hydrochloric acid pressure or the partial hydrochloric acid pressure in the carrier gas, preferably, hydrogen, may be selected from a wide range of values. It may, for example, range between approximately 20 and approximately 10,000 Pa for silicon-germanium comprising from approximately 10% to 50% of germanium.

The applicant has, in particular, performed tests with silicon-germanium comprising approximately 30% of germanium. The etching has been obtained with a good selectivity for:

pure hydrochloric acid at a pressure on the order of 30,000 Pa, the temperature being approximately 650° C., hydrochloric acid mixed with hydrogen, the partial pressure of hydrochloric acid being on the order of 20 Pa, the partial pressure of hydrogen being on the order of 2,000 Pa, the temperature being approximately 700° C.

Of course, the present invention is likely to have various, alterations, improvements, and modifications which will readily occur to those skilled in the art. In particular, it should be understood by those skilled in the art that the partial hydrochloric acid pressure has an influence upon the selectivity and the etch speed.

Figure 2:
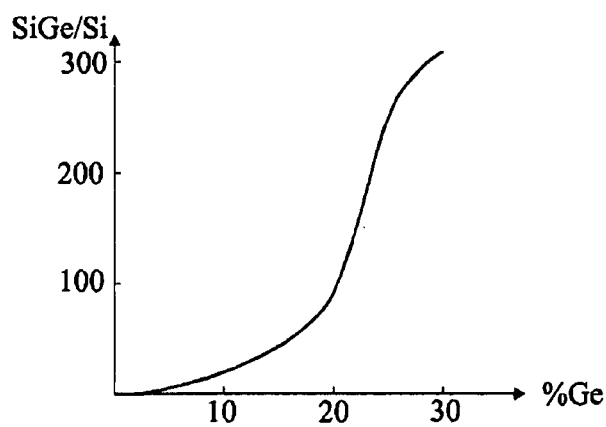
FIG. 2 is a diagram illustrating the variation of the etch selectivity of a silicon-germanium layer with respect to a silicon layer according to the proportion of germanium contained in the silicon-germanium layer according to an embodiment of the present invention.

For example, FIG. 2 schematically illustrates a graph indicating for a partial hydrochloric acid pressure on the order of 20 Pa, a partial hydrogen pressure on the order of 2,000 Pa, and a 700° C. etch temperature, the etch selectivity of the silicon-germanium with respect to silicon, that is, the ratio of their etch speeds, according to the germanium proportion in the silicon-germanium. For the currently-used range of variation of the germanium in the silicon-germanium between 20% and 30%, the selectivity ranges between 100 and more than 300, that is, much greater than the values on the order of 70 observed for a known Ar/CF$_4$ plasma etch method.

It should be understood by those skilled in the art that, if the germanium proportion is high, greater than 30%, the partial hydrochloric acid pressure and the temperature may be lowered to better control the etching with a relatively low speed while keeping a high selectivity. Conversely, if the germanium proportion is relatively low, the partial hydrochloric acid pressure and/or the temperature may be increased to accelerate the etching, the presence of hydrogen also being a factor increasing the etch speed.

Figure 3A:
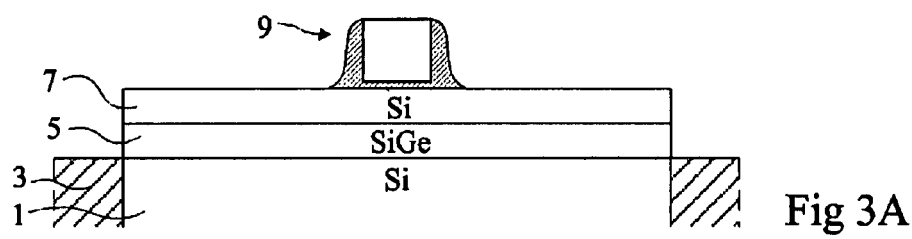
FIGS. 3A and 3B are cross-section views illustrating different steps of the forming of a MOS transistor according to an application of the present invention.
Figure 3B:
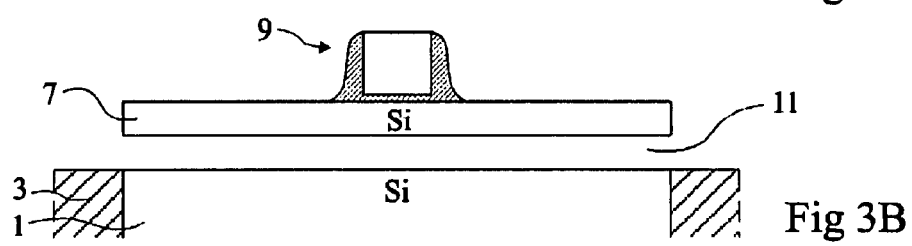

FIGS. 3A and 3B are cross-section views illustrating an application of the present invention to the forming of an SON-type MOS transistor.

As illustrated in FIG. 3A, it is started from a structure similar to that of FIG. 1A. An insulated gate 9 of the transistor is formed on a single-crystal silicon layer 7, formed on a sacrificial silicon-germanium layer 5 which extends on an active region 1 defined in a single-crystal silicon substrate by insulation areas 3. Silicon layer 5 may have a thickness lower than approximately 20 nm, and even lower than approximately 10 nm, for example, from 6 to 7 nm. Preferably, silicon-germanium layer 7 comprises from approximately 20% to 40% of germanium and has a thickness lower than 30 nm.

Single-crystal silicon-germanium 5 is then selectively etched under single-crystal silicon 7, by chemical vapor etching with hydrochloric acid.

As illustrated in FIG. 3B, due to the selectivity of the etch method according to the present invention, it is not necessary to use a mask to protect the upper surface of layer 7. The method is thus self-aligned.

Figure 1C:
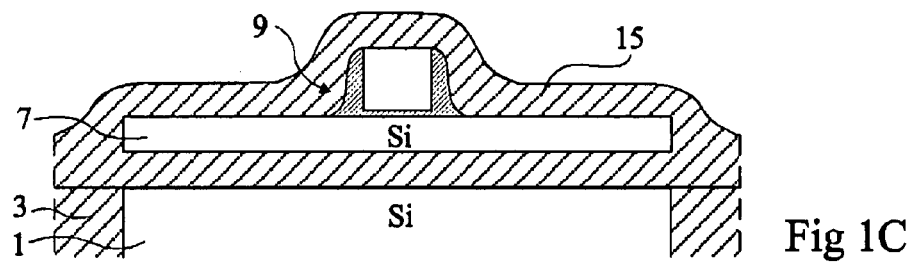

The method carries on to complete the forming of the component. For example, as described in relation with FIG. 1C, empty interval 11 resulting from the removal of layer 7 is filled with one or several selected materials.

The method for etching single-crystal silicon-germanium in the presence of single-crystal silicon according to the present invention is usable on forming of a great number of components. It is most particularly adapted to the etching of a sacrificial silicon-germanium layer under a silicon layer.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for isolating a first single-crystal layer from an underlying single-crystal substrate in a semiconductor device without using a mask, the first single-crystal layer and the underlying single-crystal substrate being formed using silicon, the method comprising:

forming a second single-crystal layer of silicon-germanium on the substrate, wherein a germanium proportion in the silicon-germanium is in a range between approximately 10% to approximately 50%;

forming the first single-crystal layer on the second single-crystal layer;

removing the second single-crystal layer using a chemical etch based on hydrochloric acid in gaseous phase at a temperature selected from a range between approximately 450° C. and approximately 700° C.; and selecting the temperature based at least partially on the germanium proportion in the silicon-germanium.

2. The method of claim 1, wherein removing the second single-crystal layer is conducted with lateral and horizontal etching.

3. The method of claim 1, wherein the first single-crystal layer is isolated from the substrate using a vacuum.

* * * * *